(12) United States Patent
Steinich

(10) Patent No.: US 11,867,536 B2
(45) Date of Patent: Jan. 9, 2024

(54) MAGNETOSTRICTIVE POSITION SENSOR WITH DETECTOR COIL IN A CHIP

(71) Applicant: ASM Automation Sensorik Messtechnik GmbH, Moosinning (DE)

(72) Inventor: Klaus Manfred Steinich, Zorneding / Pöring (DE)

(73) Assignee: ASM Automation Sensorik Messtechnik GmbH, Moosinning (DE)

( * ) Notice: Subject to any disclaimer, the term of this patent is extended or adjusted under 35 U.S.C. 154(b) by 143 days.

(21) Appl. No.: 17/322,589

(22) Filed: May 17, 2021

(65) Prior Publication Data

US 2021/0381852 A1 Dec. 9, 2021

(30) Foreign Application Priority Data

Jun. 4, 2020 (DE) .......................... 102020114882.8

(51) Int. Cl.
*G01D 5/20* (2006.01)
*H10N 35/01* (2023.01)
*H10N 35/80* (2023.01)
*H10N 35/00* (2023.01)

(52) U.S. Cl.
CPC ........... *G01D 5/2006* (2013.01); *H10N 35/01* (2023.02); *H10N 35/101* (2023.02); *H10N 35/80* (2023.02)

(58) Field of Classification Search
CPC ........ H01L 41/06; H01L 41/125; H01L 41/47
See application file for complete search history.

(56) References Cited

U.S. PATENT DOCUMENTS

| 5,747,986 | A | 5/1998 | Hristoforou | |
| 7,808,231 | B2* | 10/2010 | Steinich | G01D 5/485 |
| | | | | 324/207.13 |
| 2003/0151402 | A1* | 8/2003 | Kindler | G01B 7/003 |
| | | | | 324/164 |
| 2004/0045353 | A1 | 3/2004 | Patel | |
| 2007/0203667 | A1 | 8/2007 | Watanabe et al. | |
| 2020/0025594 | A1* | 1/2020 | Kántor | G01D 5/485 |

FOREIGN PATENT DOCUMENTS

| DE | 19917312 A1 | 10/1999 | |
| DE | 20011223 | 11/2000 | |
| DE | 10201880 A1 * | 7/2003 | ........... G01D 11/245 |
| DE | 10201880 A1 | 7/2003 | |
| DE | 202004006144 | 8/2004 | |
| DE | 102009003924 A1 | 7/2010 | |
| DE | 102013209808 A1 | 11/2014 | |
| DE | 102015108569 A1 | 12/2016 | |
| DE | 112015005195 | 8/2017 | |
| EP | 2336730 A1 | 6/2011 | |
| EP | 2396628 A1 | 12/2011 | |

(Continued)

*Primary Examiner* — Farhana A Hoque
*Assistant Examiner* — Dilara Sultana
(74) *Attorney, Agent, or Firm* — Head, Johnson, Kachigian & Wilkinson, PC

(57) ABSTRACT

To reduce the construction effort and also to make it smaller, the detector coil (6) is formed in the detector head (7) of a magnetostrictive position sensor (100) in a semiconductor chip (2), in which at the same time also the evaluation circuit (16) is formed and—if biased electrically and by means of direct current—also the then necessary separate bias coil (18).

18 Claims, 7 Drawing Sheets

(56) References Cited

FOREIGN PATENT DOCUMENTS

Figure 1A:
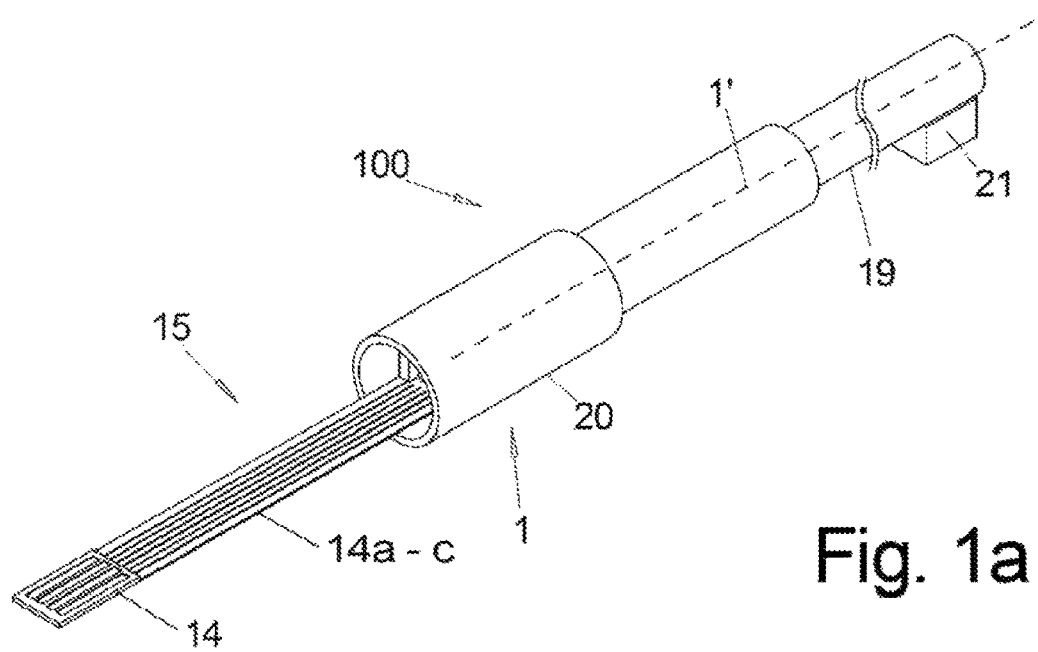

| EP | 2396628 B1 | * | 12/2012 | ............. G01D 5/485 |
|----|------------|---|---------|--------------------------|
| EP | 1818653 B1 | * | 11/2016 | ............... F41G 3/22 |
| JP | 2003329443 A | * | 11/2003 | ............... G01C 9/06 |
| JP | 2010225698 A | * | 10/2010 | |
| WO | WO2010076330 | | 7/2010 | |
| WO | WO2019169006 A2 | | 9/2019 | |

\* cited by examiner

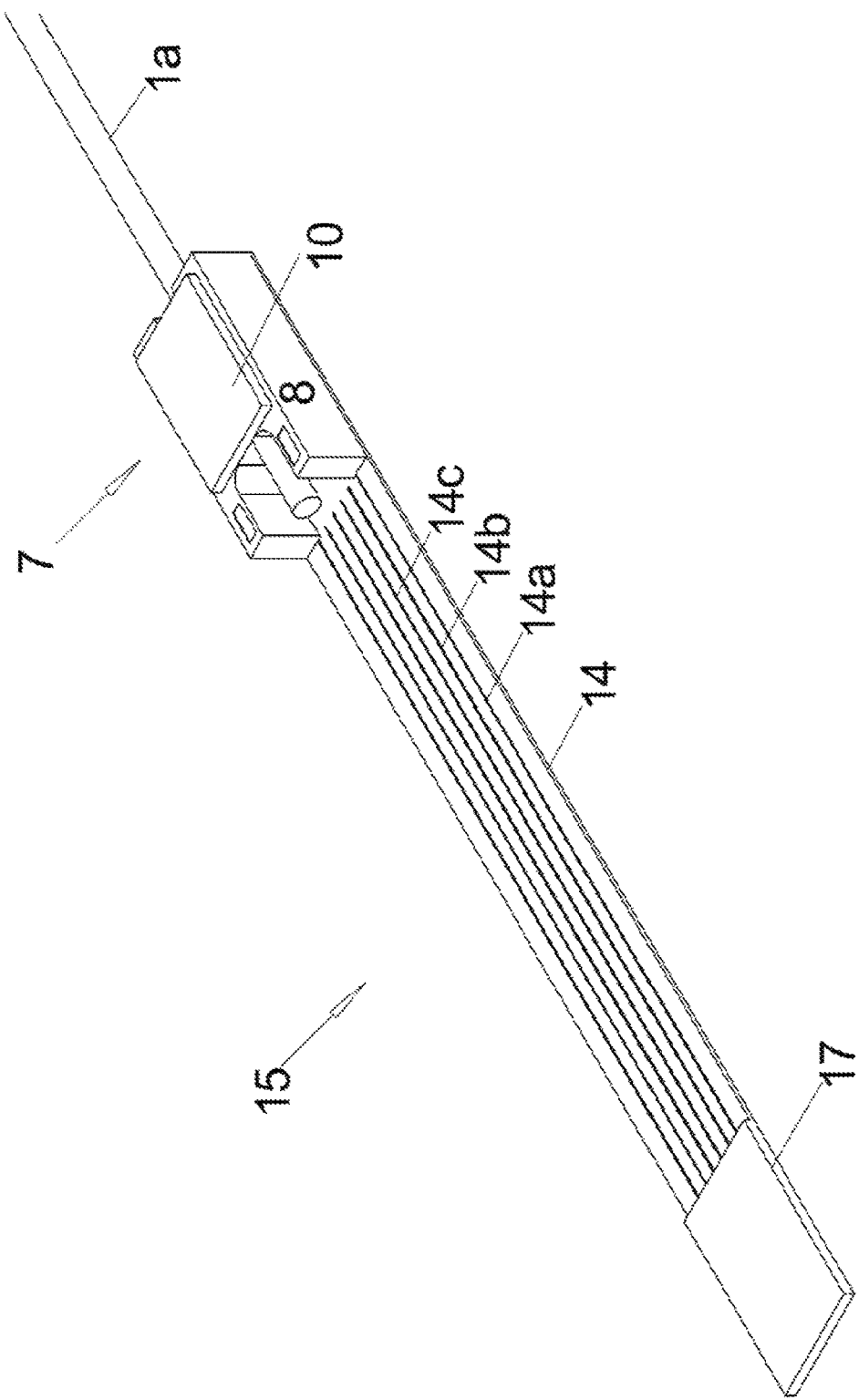

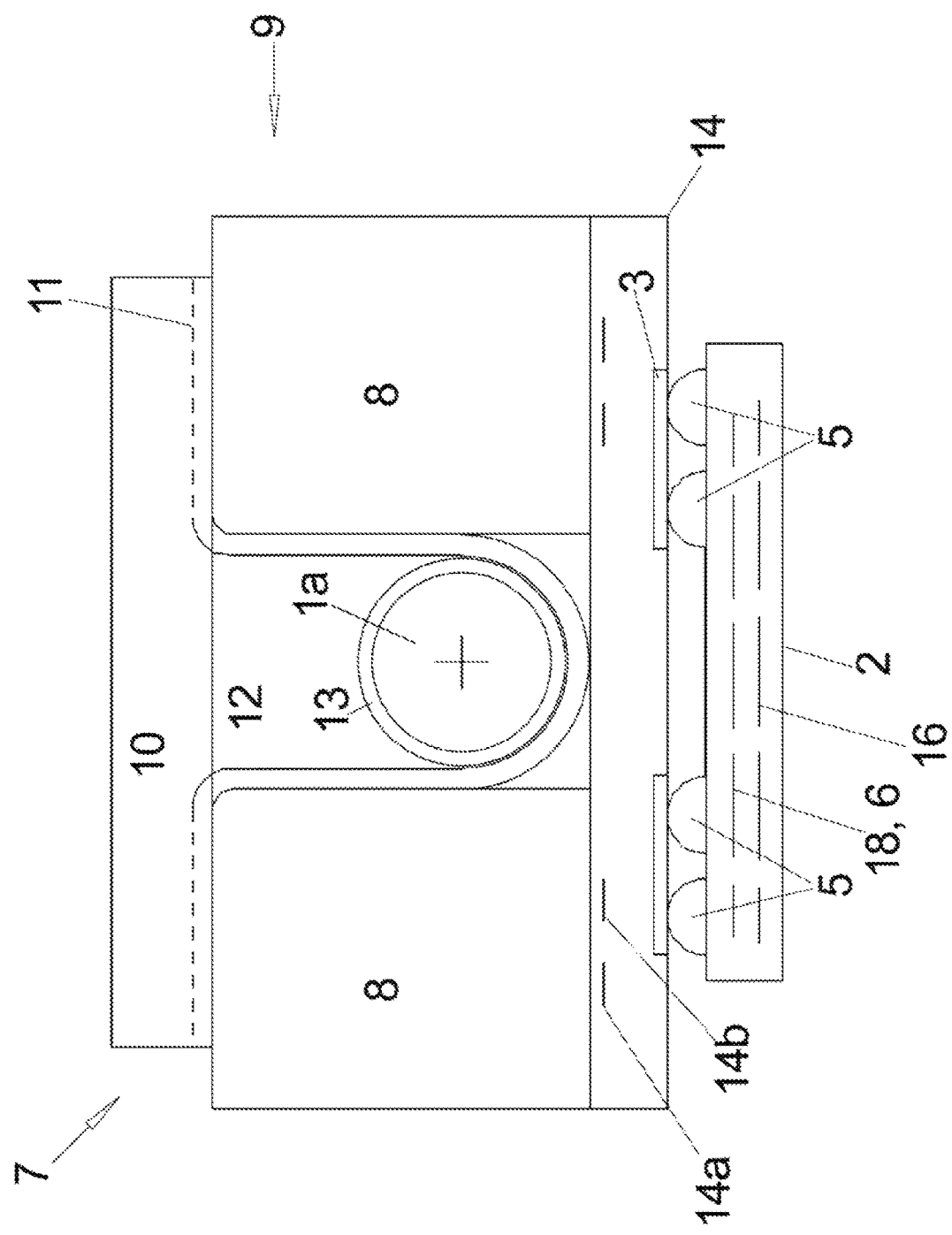

MAGNETOSTRICTIVE POSITION SENSOR WITH DETECTOR COIL IN A CHIP

I. APPLICATION AREA

The invention relates to position sensors, in particular their detector unit, based on the principle of time-of-flight measurement of mechanical-elastic density waves (MEDW) in a waveguide, which comprise, in addition to this waveguide, a position element which is movable relative thereto and generates or detects the MEDW.

II. TECHNICAL BACKGROUND

The waveguide usually consists of a tube, a wire or a ribbon, and may also serve as an electrical conductor. The waveguide can further be arranged in a shaped, linear or circular, body of non-magnetic material, e.g. plastic or metal, for receiving and supporting the waveguide.

Based on the Wiedemann effect, a current pulse fed into the waveguide generates a torsional pulse of a MEDW when superimposed on an external magnetic field directed laterally onto the magnetostrictive waveguide and originating from the position element, in particular a position magnet, which propagates at approximately—depending on the E-modulus or shear moduli of the waveguide material used—2.500 m/s-6,000 m/s from the point of origin, e.g. the position of the position element, in both directions in the waveguide.

At one point, usually at one end of the waveguide, the torsional component of this mechanical-elastic density pulse in particular is detected by a detector unit, which is usually in a fixed position with respect to the waveguide. The time period between the triggering of the excitation current pulse and the reception of this MEDW is thereby a value for the distance of the displaceable position element, e.g. the position magnet from the detector unit or also the coil or the electromagnet.

Such a typical sensor is described in U.S. Pat. No. 5,590,091 as well as U.S. Pat. No. 5,736,855.

The main focus of the present invention is on the detector device.

In the prior art, this comprises a detector coil which is either arranged around the waveguide or, as a so-called Villary detector, is arranged around a Villary tape which extends transversely, in particular at a 90° angle, from the waveguide and is connected to it, in particular mechanically fixed, e.g. welded, in such a way that the torsional pulse running in the waveguide is transformed in the Villary band into a longitudinal wave.

Such a longitudinal wave compresses or stretches the magnetoelastic element, i.e. the waveguide or Villary band, elastically in the crystalline region, and therefore changes its permeability. For this purpose, the Villary tape or waveguide is made of material with the highest possible change in magnetic permeability $\Delta\mu r$, e.g., a nickel alloy, or other suitable materials. So-called constant modulus alloys, in which the temperature coefficient of the E- and/or shear-modulus can be influenced and, in particular, kept constant over wide temperature ranges, have also proved to be a compromise between the properties sought. In this case, the form of an inherently stable strip material of approximately 0.05-0.2 mm thickness and 0.5-1.5 mm width is selected.

Because of $$\Delta U \approx -N \times \frac{\Delta \Phi}{\Delta t} \rightarrow \Delta U \approx -N \times \frac{\Delta B \times A}{-\Delta t} = N \times A \times \frac{\mu_0 \times \Delta\mu_{r} \times H}{\Delta t}$$

is $$\Delta U \approx \frac{\Delta\mu_r}{\Delta t} \times K$$

since the values for $\mu_0$, I, N, L can be assumed as constants.

The mechanical-elastic density wave passing through a magnetoelastic element, e.g. the Villary tape, thus manifests itself in a voltage change $\Delta U$, which can be tapped as a useful signal at the detector coil.

As can be seen, the larger the change in magnetic permeability $\Delta\mu r$, the larger the $\Delta$ of a useful signal U.

In addition, a range of the curve $\Delta\mu r(H)$, i.e. the magnetic permeability plotted against the magnetic field strength, is desired as an operating point or operating range, in which the magnetic permeability $\Delta\mu r$ changes as linearly as possible, but as strongly as possible relative to the cause, which is why an attempt is made to make the function $\Delta\mu r(H)$ as steep as possible in the rising flank and to establish the operating range there, in the approximately linear range.

In the prior art, a so-called bias magnet in the form of a permanent magnet is arranged in spatial proximity to the detector coil, e.g. parallel to the Villary tape, for setting the operating point.

In addition to the magnetic parameters of the at least one bias magnet, the operating point of the detector unit depends mainly on its positioning relative to the waveguide.

A disadvantage is that the detector coils, for which the number of turns is primarily important, have been relatively large up to now.

If they are to be additionally protected against external magnetic fields by a housing made of ferritic material, they are built even larger.

Regardless of whether such detector coils are wound from wire and manufactured separately and then placed on a printed circuit board on which the evaluation circuit is located or away from it, the electrical paths between the coil and the evaluation circuit require a certain minimum length, and the cross-sections of the conductive paths or wires require a minimum cross-section due to the manufacturing process, which requires a relatively strong input signal to be detected because of the electrical losses that occur in the process, which increase with this size.

On the other hand, the sensitivity of such a detector unit increases with the number of windings of the coil, but this can only partially compensate for the aforementioned effects, especially since a higher number of windings increases the structural size of the detector unit.

Such detector coils must not contact the magnetostrictive element, i.e. the waveguide or a so-called Villary tape which extends transversely from it, but should be arranged as close as possible to the magnetostrictive element in order to obtain a strong useful signal.

A detector unit with a detector coil must therefore not be confused with the use of a so-called XMR sensor as a detector unit, which may even be attached to the magnetoelastic element, since this is a completely different operating principle than that of a detector coil.

III. PRESENTATION OF THE INVENTION a) Technical Object

It is therefore the object according to the invention to provide a magnetostrictive position sensor whose detector unit comprises a detector coil and an electronic evaluation circuit, whereby the detector unit is to be very small, can be manufactured inexpensively and can generate a sufficient useful signal even with a weak $\Delta\mu r$ input signal.

b) Solution of the Object

This object is solved by the features of claims 1, 17 and 18. Advantageous embodiments result from the subclaims.

With regard to the position sensor, this object is solved in that, firstly, the detector coil is formed in or on a semiconductor substrate, in particular as part of a semiconductor chip. As a result, a coil with, for example, a predetermined number of turns can be formed substantially smaller, whereby the entire detector unit can be substantially smaller than before.

For this, it is useful to keep in mind the dimensions involved:

In the printed circuit boards (PCBs) used to date, the strip conductors have a minimum width of approx. 100 µm and the spacing between the tracks can be a minimum of 150 µm.

In contrast, structures can be created in a semiconductor chip, for example strip conductors or the width of the turns of a coil, which are only 1 µm, i.e. finer by a factor of 100.

Accordingly, a hundred times the number of turns can be achieved with a flat coil of the same diameter.

In addition, the strip conductors between the individual electronic components of the integrated evaluation circuit (IC) and also the length of the strip conductors from the detector coil to the evaluation circuit—which are preferably both located in the same chip—are shorter by this factor than on a PCB, which again offers advantages.

Of course, the production of a coil as part of a chip is much more complex than as part of a printed circuit, especially with regard to the initial effort required to produce such a chip, but this enables a much higher sensitivity of the position sensor and, with a correspondingly high number of units, a lower price.

Due to the arrangement of the evaluation circuit with all components—signal conditioning, filtering, regulation, noise suppression—the common accommodation together with the detector coil in one and the same chip is on the one hand very fail-safe, due to a low number of exposed connections, and the entire detector unit is more EMC-resistant than in a solution as PCB due to the short interconnection lines within the chip.

On the other hand, this object is solved by the fact that the detector coil is designed as a flat coil, i.e. in the form of a spiral lying in one plane, in order to be able to approach the e.g. waveguide with the windings as closely as possible.

The detector coil can comprise several flat coils, but preferably it consists of only one flat coil, which is possible due to the small width of a turn, so that a sufficient number of turns can also be accommodated in only a single coil plane.

As a result, it is not even necessary to arrange several flat coils on top of each other—which are then electrically connected to each other as sub-coils to form a common detector coil—in the chip, although their axial distance between the sub-coils would then still only be in the single-digit µm range.

In order to be able to evaluate the useful signal, it is known to bring the magnetoelastic effect of the waveguide into an operating point of the magnetization curve which is favorable for the evaluation by premagnetization, in particular into the most linear range of this magnetization curve.

For this purpose, one or more permanent magnets are arranged as bias magnets on the waveguide so that it lies in the magnetic field of the bias magnets, preferably the bias magnet is attached at an axial position on or near the detector unit.

However, since such a bias magnet represents a macroscopic three-dimensional body, on the one hand this increases the dimensions of the detector unit, and on the other hand arranging and fixing, especially gluing, is mechanically complex.

Preference is therefore given in the context of the invention to electrical biasing, which can be carried out by means of direct current or by means of alternating current.

If biasing is to be performed by means of direct current, a separate bias coil, which is therefore galvanically isolated from the detector coil, is advantageous for this purpose.

However, the detector coil can also be used simultaneously as a bias coil, in which case the biasing is performed by means of alternating current, and the evaluation circuit contains a decoupling circuit to decouple the useful signal from the bias current fed into the bias coil, for which purpose an inductor is generally used.

The bias coil, which is preferably also a flat coil, preferably runs with its axial direction, for example the perpendicular to its spiral plane, transverse to the waveguide direction, in particular perpendicular thereto, in that the coil plane of the flat coil lies parallel to the waveguide direction.

Based on the available manufacturing methods of semiconductor chips, it should be possible to manufacture the width and/or thickness of a conductor track, in particular the winding of a coil, with a width of less than 0.1 µm, in particular with a width of less than 50 nm, especially a width of less than 10 nm, whereby already with a width in the two-digit nm range, the entire evaluation unit becomes so small that it can easily be accommodated within a protective tube around the waveguide unit.

In order to achieve a high useful signal strength, the detector coil, and thus also the entire semiconductor chip, should be arranged as close as possible, but not contacting, the magnetoelastic element to be scanned, in particular the waveguide, preferably at a distance of less than 10 µm, in particular less than 5 µm, in particular less than 3 µm, whereby the distance can be ensured by an interposed, electrically non-conductive, separating foil.

The semiconductor chip, in particular the detector coil, can also be arranged at a greater distance of at most 0.20 mm, better at most 0.15 mm, better at most 0.10 mm, from the waveguide, which results in particular if the waveguide and semiconductor chip are located on opposite sides of the electronics board carrying the semiconductor chip, which already has a thickness of mostly 0.10 mm even when designed as a flexible, thin board. However, this is acceptable if the detector coil has a sufficiently large number of turns, in particular at least 50, preferably at least 100, preferably at least 200, preferably at least 400 turns.

Then an electronics board, for example a flexible or semi-flexible electronics board, can also be arranged at this distance in between, with the base body of the detector unit and the waveguide arranged on one side and the semiconductor chip with the detector coil and, if necessary, also the bias coil on the other side of its main plane.

This has the advantage of simple mechanical manufacture, since it is possible to attach said components to the various sides of the circuit board without interfering with each other. In particular, the waveguide is not attached directly to the board, but to the base body attached to the board.

In this way, the detector coil, in particular designed as a flat coil, can have a maximum diameter which is larger than the diameter of the waveguide when viewed in plan view of its coil plane, in particular in the case of a detector coil with a round outer contour in plan view, and thus the diameter of the detector coil can also be up to 2 mm, but better only up to a maximum of 1.5 mm, and even better up to a maximum of 0.8 mm.

Even with a non-circular, in particular rectangular, outer contour in plan view, the chip should have a maximum extension of no more than 2.5 mm, better no more than 1.7 mm, better no more than 1.0 mm in plan view on its main plane.

The detector coil, which is designed as a flat coil, is preferably arranged with its spiral plane parallel to the direction of the waveguide, so that the detector coil does not have to run circumferentially around the waveguide and thus has to be arranged on only one side of the waveguide, but the turns of the coil can still be positioned as close as possible to the waveguide. The same applies to a Villary tape, if one is present and represents the magnetoelastic element to be scanned.

In the case of a detector coil consisting of several sub-coils with their spiral planes spaced, for example, transversely to their main plane, these are preferably electrically connected in series, and to achieve the desired mutually reinforcing effect in the detection of the mechanical wave arriving along the magnetoelastic element.

The entire semiconductor chip should also have a maximum diameter of at most 2.5 mm, preferably at most 1.7 mm, preferably at most 1.0 mm, when viewed from above on its main plane, in particular viewed on its contact surface with the circuit board, in order to build the detector unit there so compactly, that it can be accommodated in the head hose of a protective unit, which in particular also includes a support tube for the waveguide unit, which may additionally serve as an electrical return conductor, and is arranged around the waveguide unit, onto which the head sleeve is partially pushed.

The substrate of the semiconductor chip is preferably silicon, although other semiconductor materials may also be considered.

The semiconductor chip can be used within the detector unit as a bare chip, i.e. a chip that is not enclosed by a package, but the semiconductor chip itself is soldered directly onto the board and the solder pads or strips conductors.

The electronic board on which the semiconductor chip is arranged, in particular soldered to it, can also be a composite board consisting of two sub-boards glued together.

Then a longitudinal groove can be machined in one of the two contact sides of the two sub-boards facing each other, or in both, to provide a waveguide channel between the two sub-boards glued together, into which the waveguide can be inserted and, if necessary, also fastened.

The detector unit, in particular the semiconductor chip, is again arranged on one of the outer surfaces of the board composite facing away from the contact surfaces.

Especially when the board used is a flexible or semi-flexible board, a base body is required for the stable design of the detector unit, which rests against one of the sides of the board and is attached to it, preferably glued.

In this case, the waveguide should run in a waveguide channel formed between the base body and the—then mostly flexible—circuit board, whereas in the case of the circuit board composite described above, at least one of the circuit boards is embodied as a rigid electronic circuit board, thus providing a stable base body.

(Board Composite as an Alternative)

For this purpose, the base body—viewed in the direction of the waveguide and the waveguide channel—can be U-shaped, i.e. portal-shaped, and fixed to the board with its free-ending legs, which simplifies handling during assembly.

Alternatively, the base body may comprise two boundary bodies which are fixed to the board spaced around the waveguide channel, preferably with a bridge plate extending across the waveguide channel on the side of the two boundary bodies facing away from the board, which bridge plate is fixedly connected to both boundary bodies and stabilizes the base body.

If the biasing is not to be performed electrically but by means of a permanent magnet, either a bias magnet is arranged in the connecting leg of the U-shaped base body or in the bridge plate, or one bias magnet each is arranged and fixed, in particular glued, in the—preferably the outer sides—free-ending legs of the base body or of the two limiting bodies.

With regard to the method for operating such a position sensor, biasing by means of direct current is preferably used for electrical biasing, since there is less risk of the measurement result being influenced by external electromagnetic radiation than in the case of biasing by means of alternating current.

However, this not only requires a galvanically isolated bias coil separate from the detector coil and connected to each other at most via the external circuit, but the DC current must also be introduced into this bias coil completely decoupled from the useful signal so that the latter is not distorted by the bias current.

Preferably, the bias current is introduced in a pulsed manner in time, in particular with a pulse during the measurement, in order to keep the energy requirement for electrical biasing low.

With regard to the process for manufacturing such a position sensor, in particular its semiconductor chips with the detector coil integrated therein, the semiconductor chip can be manufactured particularly small if the so-called EUV method is used, i.e. ultraviolet light with an extremely short wavelength of, for example, 13.5 nm is used to expose the masks and/or layers of photoresist during chip manufacture, as a result of which the structures that can be achieved are extremely small.

Since in the classical production of semiconductor chips by means of photographic processes the up-front costs for the design of the mask set and the production of the masks as well as the production equipment required for this are very high, it is proposed according to the invention to produce the semiconductor chips by a process which does not require covering masks for the layers of the semiconductor chip to be produced, in that a layer which is only required in certain areas, of photoresist or of semiconductor material is either applied from the outset only in the required areas in liquid or paste form by means of an application nozzle, and subsequently cured or applied as a continuous layer and subsequently burned away in the unneeded areas by means of a controlled high-energy electromagnetic steel, in particular an electron beam, preferably for acceleration by means of many beams simultaneously, in particular with more than 100 or more than 1000 beams simultaneously.

With the aforementioned partial application, it may not yet be possible to produce structures in the nm range for semiconductor chips, but only in the single-digit or even low double-digit μm range, which could, however, result in sufficiently small semiconductor chips for the present purpose and due to the associated advantages.

C) EXAMPLES OF EMBODIMENTS

Figure 2A:
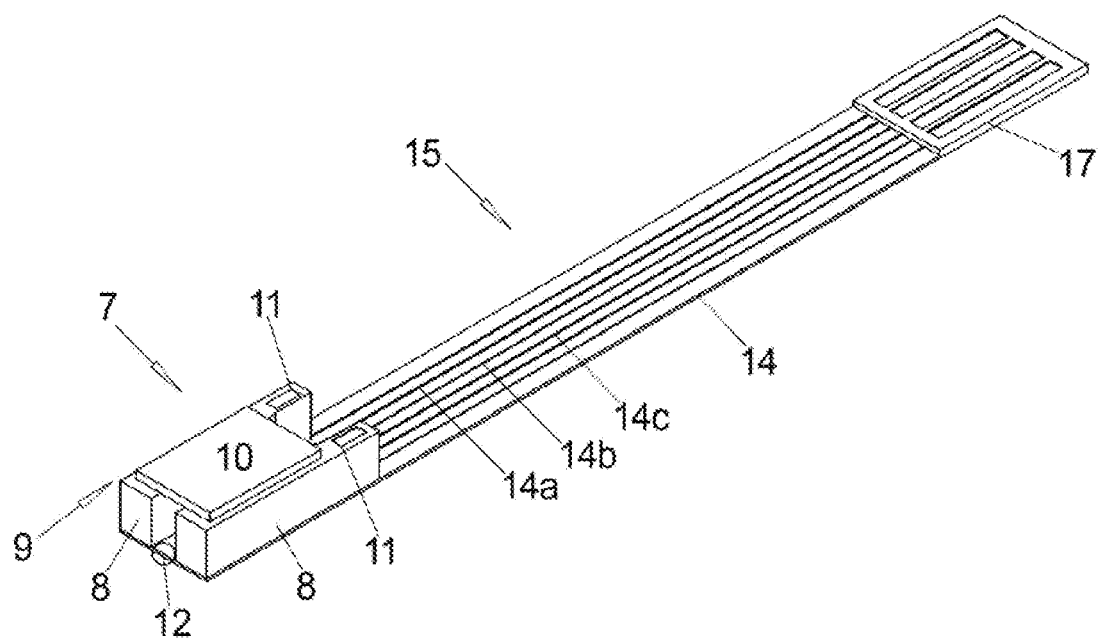
Figure 2B:
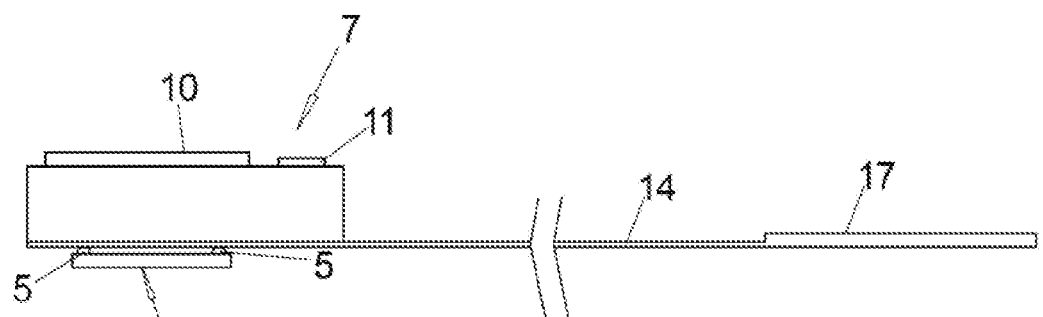
Figure 2C:
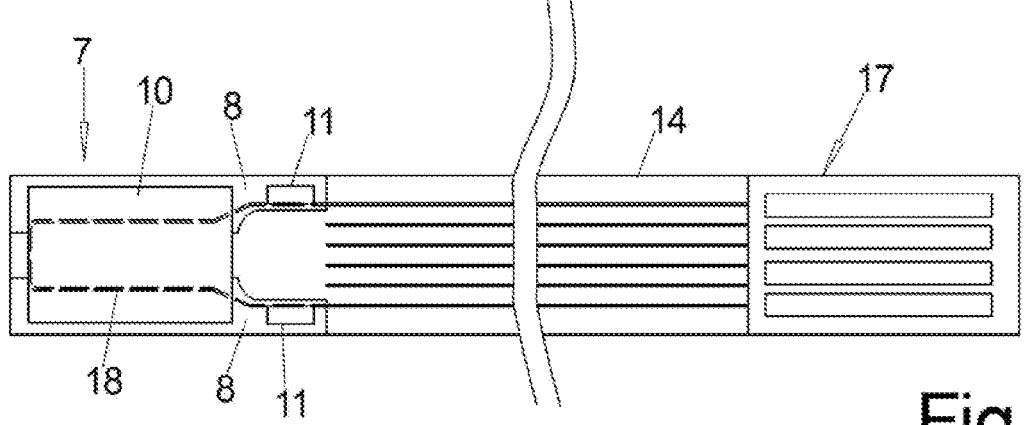
Figure 3A:
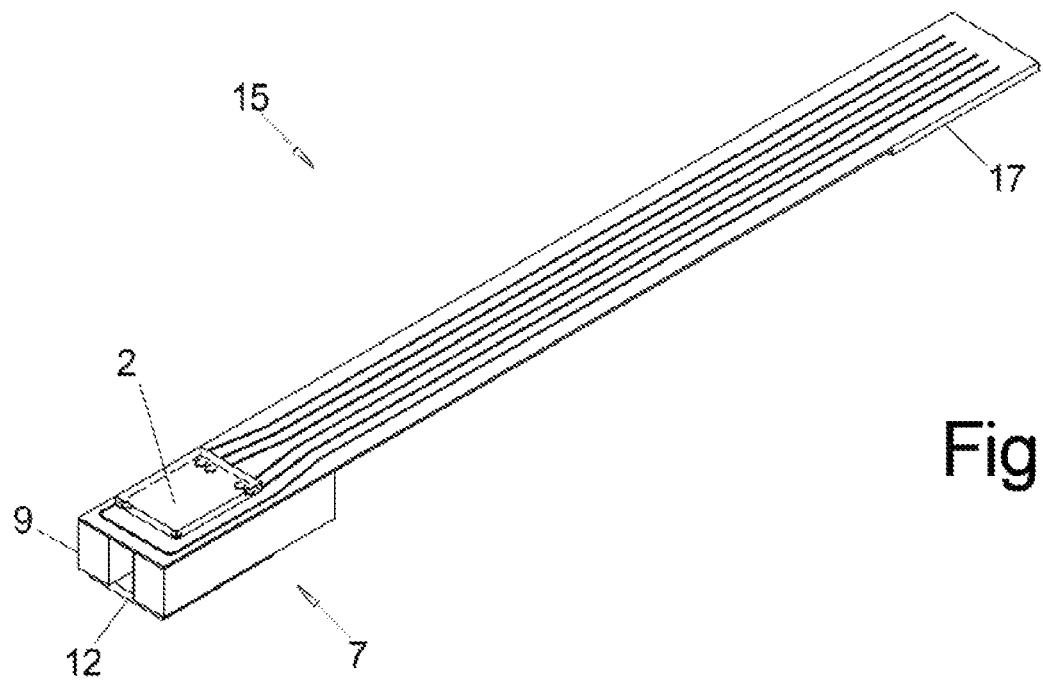
Figure 3B:
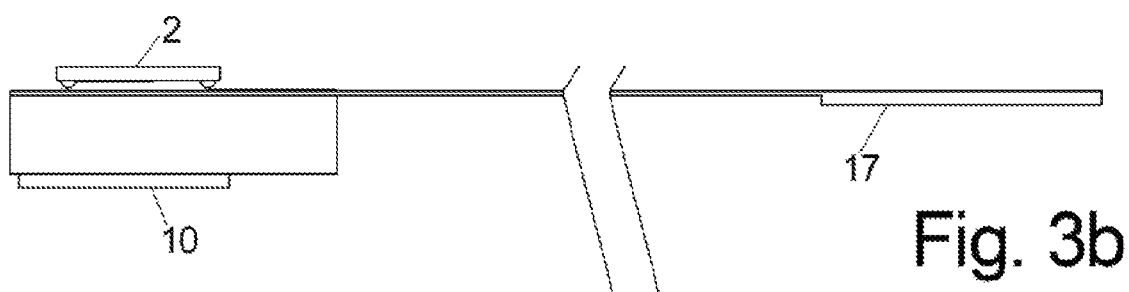
Figure 3C:
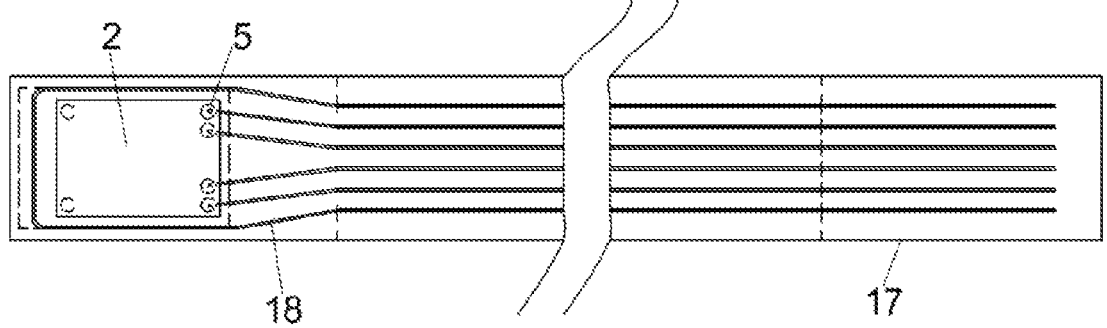

Embodiments according to the invention are described in more detail below by way of examples, which are showing FIG. 1a, b: a position sensor with waveguide unit, detector unit and encoder magnet, in perspective view and in longitudinal section, FIG. 1c: the position sensor of FIGS. 1a, b in perspective view, but without the protective tube, FIG. 2a-c: a first embodiment of the detector unit in perspective view obliquely from above, side view and top view, FIG. 3a-c: the detector unit of FIGS. 2a to c in perspective view obliquely from below as well as matching side view and view from below, FIG. 4a-c: a second embodiment of the detector unit in perspective view obliquely from above and side view and top view, FIG. 5: a front view of the detector unit, FIG. 6a-c: the semiconductor chip of the detector unit in perspective view, side view and top view.

FIGS. 1a, b show the entire position sensor 100 consisting of the waveguide unit 1—shown in a shortened form—in which the waveguide 1a runs as a magnetostrictive element, and the detector unit 15, as well as the encoder magnet 21, which is movable along the waveguide unit 1 and whose position is detected in the axial direction 1', the direction in which the waveguide 1a or the waveguide unit 1 runs.

Figure 1B:
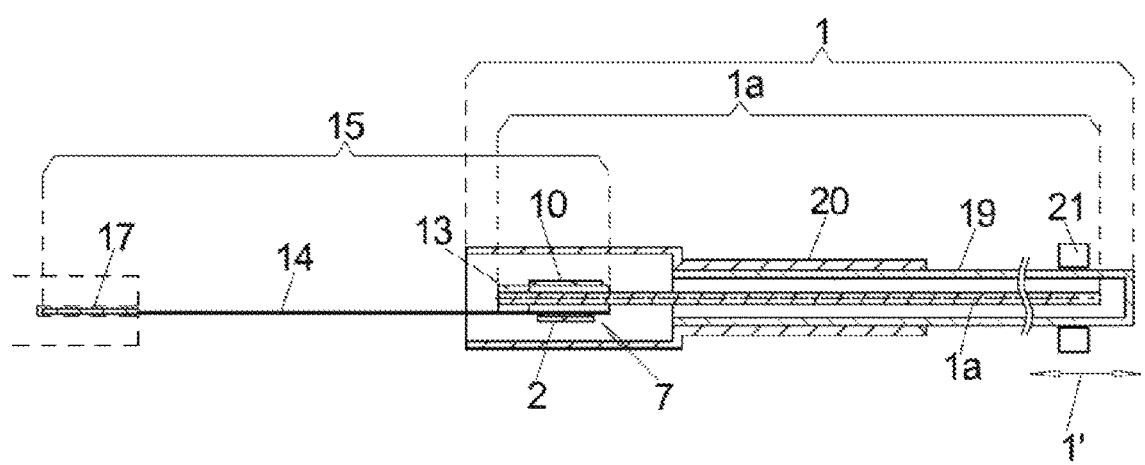

The encoder magnet 21 may annularly surround the waveguide unit 1, as shown in FIG. 1b, or may be present in only a portion of the circumference of the waveguide unit 1 as viewed in the circumferential direction, as shown in FIG. 1a, but is generally not adjacent to the waveguide unit 1.

The waveguide unit 1 includes a support tube 19 in which the waveguide 1a extends, generally centrally, and with respect to which it is fixed and supported in a special manner, but this is of no consequence to the present invention.

At the detection end shown, a head sleeve 20 is plugged onto the support tube 19, which together form a protective unit 19+20, the head sleeve 20 projecting axially beyond the support tube 19 and having a larger internal diameter in this projection than the support tube 19, the detector unit 15 being partially located, namely with the detector head 7, still in the region of the head sleeve 20, but projecting out of its end open at the measuring end.

At the opposite end, on the other hand, the support tube 19 of the waveguide unit 1 is mostly closed.

The head sleeve 20 also simplifies assembly, since it can be brought into position and connected to the support tube 19 only after the waveguide 1a projecting from the end face of the support tube 19 has been connected to the detector head 7, for example by being slid onto the support tube 19 before assembly and slid over the waveguide 1a after it has been fastened to the detector head 7 and connected to the support tube 19 in this protective position, for example by being glued or encapsulated.

FIG. 1c shows, in the same perspective view as FIG. 1a, the position sensor 100 without the protective unit, from which it can be seen that the waveguide 1a not only projects into the detector head 7, but preferably passes through it over its entire axial length.

The following FIGS. 2a to 4c show the detector unit 15 separately and without the waveguide attached to it:

FIGS. 2a to 3c show a 1st embodiment of the detector unit 15 on the one hand in views from above, and on the other hand in views from below, as well as the corresponding side views.

From this it is clear that the detector unit 15 consists of a strip-shaped, preferably semi-flexible or flexible, electronic circuit board 14, i.e. a PCB 14, at one end of which, the measuring end, the detector head 7 is formed by means of further components, and at the other end of which, by means of corresponding contact surfaces, the detector head 7 is formed as a connector 17, which may also comprise a plate applied to the circuit board 14 for stabilizing the semi-flexible circuit board 14 in this plug area.

Detector head 7 and connector 17 are electrically connected to each other via electrically conductive tracks 14a, b, c printed on board 14, which can be formed on the upper side as well as on the lower side or only one of the two sides.

The detector head 7 is formed in that two, in this case cuboid, boundary bodies 8 are placed on the measuring end of the strip-shaped board 14 on its upper side and along its longitudinal edges and are fixed to the board 14 so that a waveguide channel 12 is formed between them which is wide enough for the waveguide 1a to extend into it.

For stabilization—see in particular FIG. 5—a bridge plate 10 is attached to the boundary bodies 8 across the upper sides of the boundary bodies 8 facing away from the board 14 and across the waveguide channel 12, thus forming a portal-shaped base body 9 of the detector head 7.

The waveguide 1a is not fastened directly to this base body 9, but indirectly by means of a fastening element in the form of a fastening bracket 11, which in this case is hat-shaped—as can best be seen in FIG. 5—and rests with its freely projecting ends on the upper sides facing away from the board 14—axially away from the bridge plate 10—of each of the boundary bodies 8, while the central part extends downwards into the waveguide channel 12 until at or near the upper side of the board 14.

The waveguide 1a lies in this U-shaped, upwardly open central part of the fastening bracket 11 and is connected, in particular firmly connected, in particular glued or clamped, to the fastening bracket 11 and thereby occupies a defined distance from the upper side of the board 14, but is not connected to any of the strips 14a, b c of the board 14 in a contacting and thus electrically conductive manner. The same applies to the mounting bracket 11.

For this purpose, in the area of the detector head 7, i.e. in the length area of the semiconductor chip 2 and/or the mounting bracket 11, a separating tube 13 with a defined wall thickness made of electrically non-conductive material is arranged around the waveguide 1a, as can also be seen in FIG. 1b.

A semiconductor chip 2—preferably made of silicon as substrate—is fixed on the underside of the board 14 facing away from the waveguide 1a as well as the limiting bodies 8 and thus the base body 9, in that the chip 2 is soldered to matching soldering areas 3 on the underside of the board 14 by means of the so-called solderballs present on it, namely raised soldering points 5, which are formed on one side of the board-shaped chip 2.

Figure 6B:
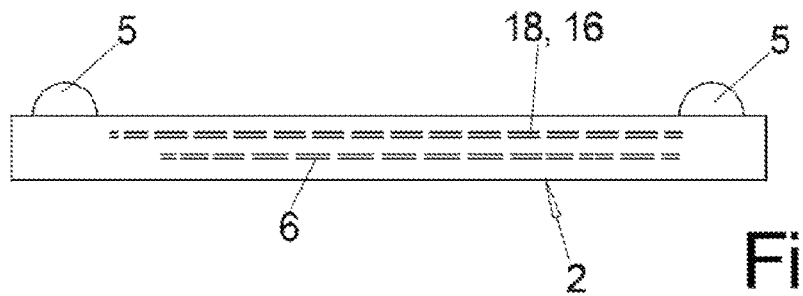
Figure 6C:
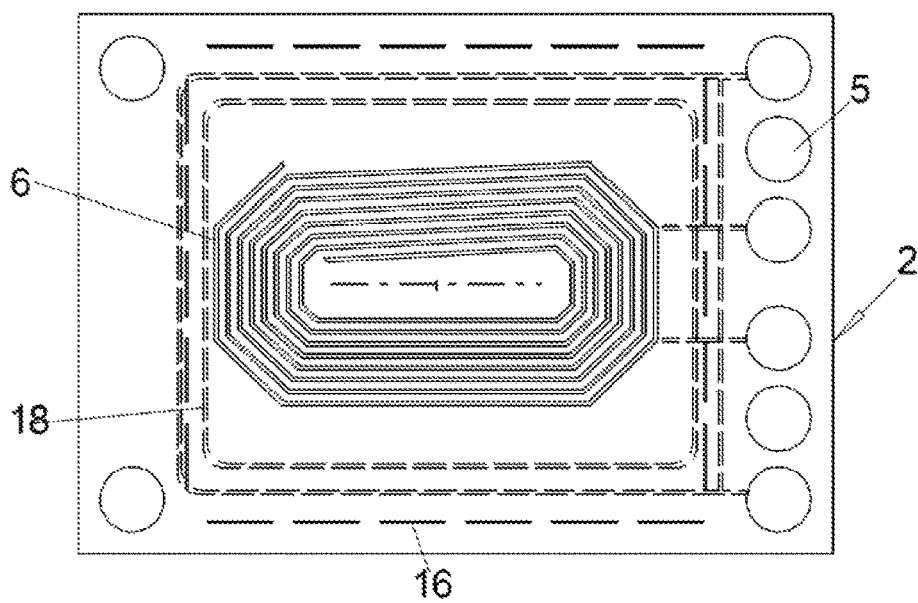
Figure 6A:
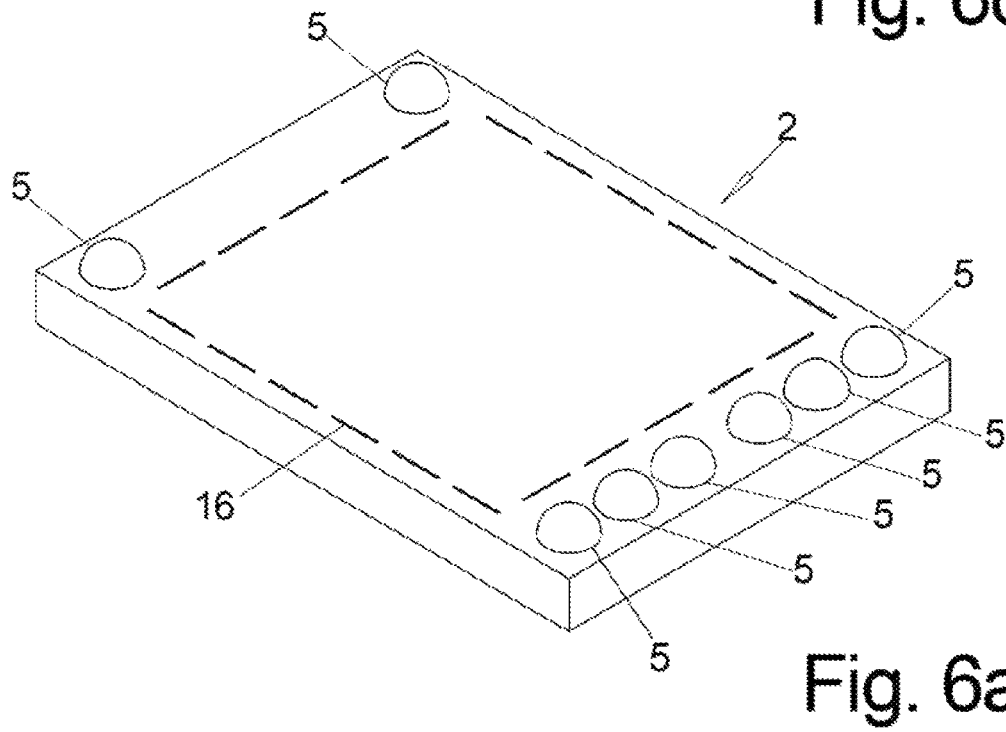

As indicated in FIGS. 6a to c, electronic components connected to one another to form electronic circuits are formed inside the plate-shaped semiconductor substrate as known—usually in several layers one above the other—to realize an electronic chip 2.

In the present case, at least one detector coil 6 is formed in the semiconductor substrate 2, preferably as a flat coil lying only in one plane, and on the other hand an evaluation circuit 16, which can be located in another plane or also in the same plane next to the detector coil 6. In this case, the detector coil 6 is of course connected to the evaluation circuit 16 in terms of signals, preferably in an electrically conductive manner, within the semiconductor substrate 2, and the evaluation circuit 16 passes on the processed signals to a component connected to the connector 17, for example an electronic controller, via the connector surfaces 17.

Due to the defined position of the solder points 5 on the semiconductor chip 2 on the one hand and the corresponding solder pads 3 on the underside of the board 14 on the other hand, as well as the defined distance between the board 14 and the chip 2, the detector coil 6, which is also arranged in a defined position within the semiconductor chip 2, is also in a defined position, in particular a defined distance, to the fastening bracket 11 and thus to the waveguide 1*a*.

This exact spatial assignment is of great importance for the quality and strength of the useful signal obtainable by the detector head 7 from the mechanical, in particular longitudinal, wave arriving along the waveguide 1*a* at the measuring end and thus at the detector head 7, which was triggered by the encoder magnet 21.

To improve the quality of the useful signal or to obtain a usable useful signal at all, a defined premagnetization of the waveguide 1*a* must take place before or during the measurement.

In the 1st embodiment of the detector unit 15 according to FIGS. 2*a* to 3*c*, a so-called electrical biasing, namely a premagnetization by means of direct current, is carried out, for which purpose a bias coil 18 is formed in the semiconductor substrate which, when acted upon by direct current, generates a magnetic field which causes the desired premagnetization of the waveguide 1*a* extending at a small distance above it.

Preferably, the bias coil 18 is energized by the evaluation circuit 16, preferably in a pulsed manner and in time with the measurements, and for this purpose the bias coil 18 must be electrically connected to the evaluation circuit 16.

Figure 4A:
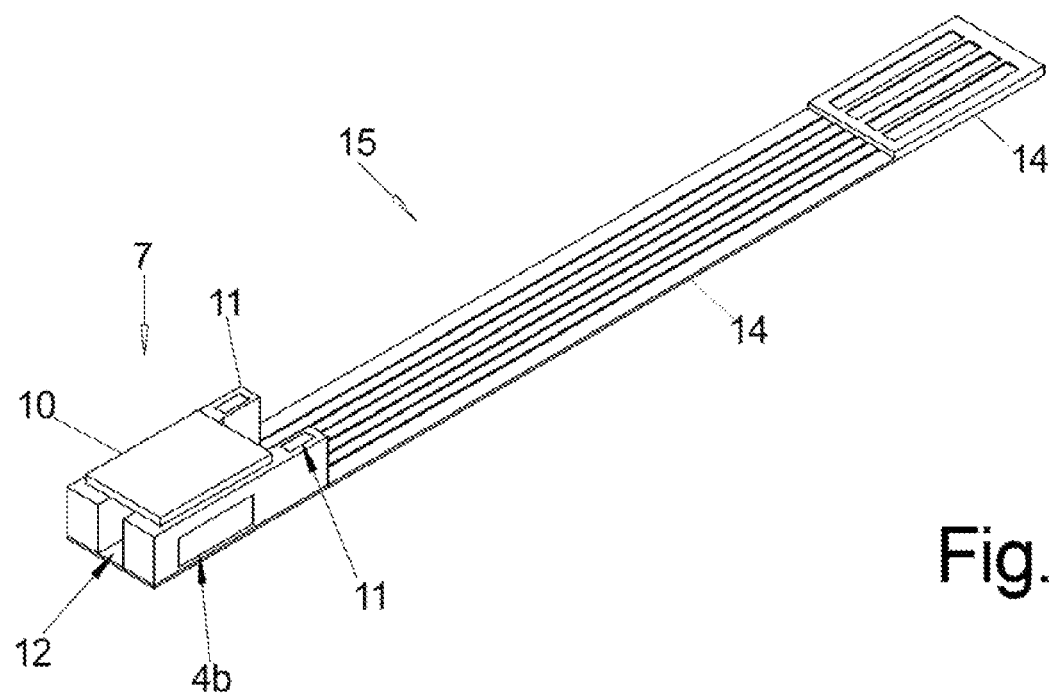
Figure 4B:
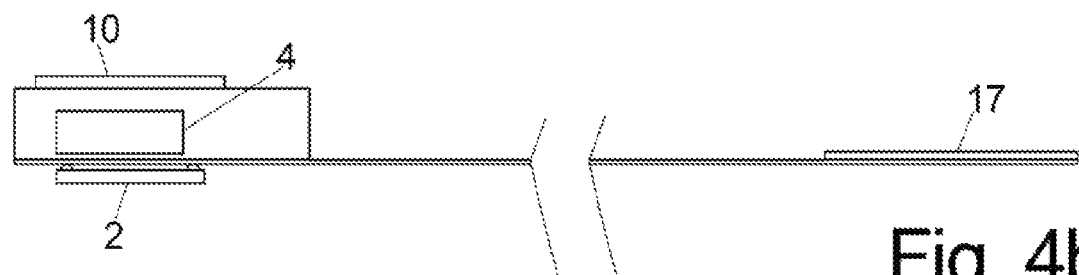
Figure 4C:
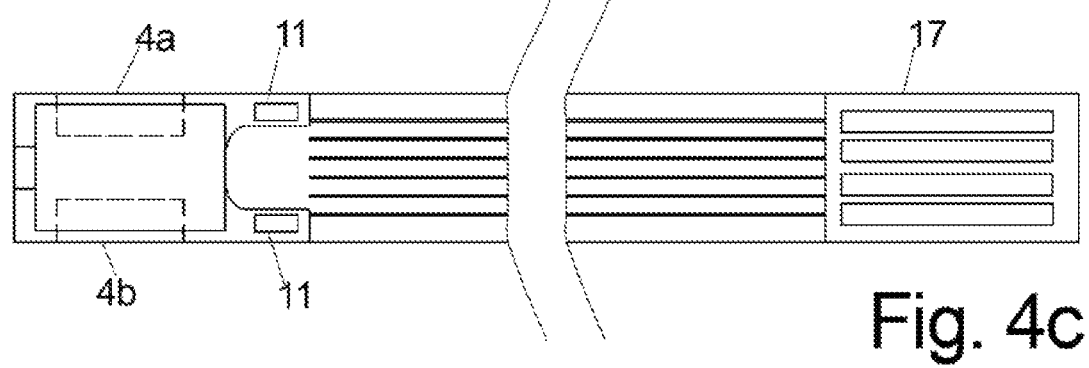

FIGS. 4*a* to *c*, on the other hand, show the classic type of premagnetization by means of a permanent magnet as the 2nd embodiment.

Therefore, a bias magnet 4*a*, *b* is arranged there in each of the two boundary bodies 8, in particular on or in its respective outer surfaces, which permanently effects this bias magnetization of the waveguide 1*a*.

For this purpose, among others, the boundary bodies 8 consist of a non-magnetic and preferably also non-magnetizable material, and/or also not of electrically conductive material, for example plastic.

With this 2nd embodiment, of course, no additional bias coil is then necessary in chip 2.

REFERENCE LIST ALES KLEIN!

1 waveguide unit
1*a* waveguide
1' running direction
2 semiconductor substrate, chip
3 soldering area
4*a*, *b* bias magnet
5 soldering point, solder ball
6 detector coil
6" coil plane
7 detector head
8 boundary body
9 base body
10 bridge plate
11 fastening element, fastening bracket
12 waveguide channel
13 separating foil, separating hose
14 electronic board, PCB
14*a*, *b*, *c* strip conductor, PCB conductor
15 detector unit
16 evaluation circuit
17 connector, connector plate, contact surface
18 DC bias coil, bias coil
19 support tube
20 head sleeve
19+20 protection unit
21 encoder magnet
100 position sensor

The invention claimed is:

1. A magnetostrictive position sensor (100) according to the time-of-flight principle of a mechanically-elastic density wave comprising:
a flexible or semi-flexible circuit board;
a waveguide unit (1) with a magnetoelastic waveguide,
a position-transmitting encoder magnet, which can be moved without contact, along the waveguide in its running direction, and
a detector unit arranged at a defined longitudinal position of the waveguide unit with a detector coil and an electronic evaluation circuit,
wherein the detector coil is formed in or on a semiconductor chip substrate and the electronic evaluation circuit is formed in or on the same semiconductor substrate as the detector coil;
the detector coil comprising at least one flat detector coil, the spiral plane of the flat detector coil being parallel to the direction of the waveguide,
wherein the semiconductor substrate is a semiconductor chip that is embodied and mounted as a bare chip, the bare chip being provided on the rear side of the circuit board,
wherein a base body, in which the waveguide is located, is fastened in the length region of the bare chip on the front side of the circuit board opposite the bare chip, so that the waveguide and the bare chip comprising the flat detector coil are located on opposite sides of the circuit board.

2. The position sensor according to claim 1, wherein the evaluation circuit is arranged as close as possible, parallel to and spaced from, the coil plane, to the detector coil.

3. The position sensor according to claim 1, wherein
at least one bias coil is arranged in the semiconductor chip substrate,
the axial direction of the bias coil is transverse to the waveguide direction, and
the bias coil is arranged at a longitudinal position close to the detector unit.

4. The position sensor according to claim 1, wherein
a bias magnet is arranged on the detector unit, on the front side of the board facing the waveguide,
one bias magnet each is arranged on both sides of the waveguide as viewed in plan view of the board.

5. The position sensor according to claim 1, wherein the width or thickness of a strip conductor in the semiconductor chip, in particular a winding of the detector coil, is less than 0.1 µm.

6. The position sensor according to claim 1, wherein the detector coil is arranged at a distance from the magnetoelastic element to be scanned which is less than 200 µm, and the distance is ensured by an electrically non-conductive separating foil, in the form of a separating hose, placed therebetween, which surrounds the waveguide.

7. The position sensor according to claim 1, wherein
the detector coil consists of several sub-coils lying one above the other in parallel planes, or
the detector coil has at least 50 turns.

8. The position sensor according to claim 1, wherein the detector coil has, in the top view of its coil plane, a maximum diameter of at most 2 mm.

9. The position sensor according to claim 1, wherein
the chip has a maximum extension of not more than 2.5 mm in the top view of its main plane.

10. The position sensor according to claim 1, wherein
the detector coil is arranged with its coil plane parallel to the running direction of the waveguide
or a villary tape attached to it.

11. The position sensor according to claim 1, wherein the semiconductor substrate is silicon.

12. The position sensor according to claim 1,
wherein in the case of several part coils, these are electrically connected in series.

13. The position sensor according to claim 1, wherein
the outer side of the semiconductor chip nearest to the detector coil faces the circuit board,
or
the semiconductor chip is arranged at the opposite end of the board with respect to its electrical contact surfaces, in particular a connector arrangement, for forwarding the signals.

14. The position sensor according to claim 1, wherein
the board is a composite board consisting of two partial boards bonded to each other,
wherein in at least one of the two partial boards there is a longitudinal groove in which the waveguide is arranged,
wherein the semiconductor chip is arranged on one of the outer sides of the printed circuit board composite.

15. The position sensor according to claim 1, wherein
the base body comprises two boundary bodies, extending in the main direction of extension of the board, with a waveguide channel therebetween, in which the waveguide lies,
a bridge plate extending over the waveguide channel and mechanically stabilizing the base body is fastened to the sides of the two boundary bodies facing away from the board.

16. The position sensor according to claim 1, wherein
a bias magnet is arranged on or in at least one boundary bodies or the bridge plate.

17. A method of operating a position sensor according to claim 1, wherein
the magnetically restrictive material, in particular the waveguide, is brought into a suitable magnetic operating point for measuring the position of the encoder magnet by means of electrical premagnetization, in that
either alternating current is introduced into the detector coil simultaneously with the measurement, the frequency of which is preferably higher than the frequency of the useful electrical signal to be expected during the measurement,
or direct current is introduced into a separate bias coil, in particular the direct current is introduced into the detector coil with decoupling from the useful signal.

18. A method of making a position sensor according to claim 1, wherein
the semiconductor chip
is produced using exposure masks with the extreme ultraviolet (EUV) method,
or
is produced without the use of exposure masks by
a respective applied layer, for example of photoresist layer, selectively removed in certain areas by means of one or a plurality of high-energy beams simultaneously, in particular an electron beam, in particular by means of the electron beam lithography (EBL) method,
or
a photoresist layer is applied only in certain areas only in the area to be coated by means of an application nozzle.

* * * * *